(12) United States Patent
Fujimatsu et al.

(10) Patent No.: US 12,184,102 B2
(45) Date of Patent: Dec. 31, 2024

(54) PROTECTIVE CIRCUIT AND ENERGY STORAGE APPARATUS

(71) Applicant: GS Yuasa International Ltd., Kyoto (JP)

(72) Inventors: Masakatsu Fujimatsu, Kyoto (JP); Kiyohiro Fujita, Kyoto (JP); Shigeki Hattori, Kyoto (JP); Akimasa Sugiura, Kyoto (JP)

(73) Assignee: GS YUASA INTERNATIONAL LTD., Kyoto (JP)

( * ) Notice: Subject to any disclaimer, the term of this patent is extended or adjusted under 35 U.S.C. 154(b) by 188 days.

(21) Appl. No.: 17/756,509

(22) PCT Filed: Dec. 2, 2020

(86) PCT No.: PCT/JP2020/044769
§ 371 (c)(1),
(2) Date: May 26, 2022

(87) PCT Pub. No.: WO2021/117565
PCT Pub. Date: Jun. 17, 2021

(65) Prior Publication Data
US 2023/0009206 A1    Jan. 12, 2023

(30) Foreign Application Priority Data

Dec. 10, 2019  (JP) .................. 2019-222966

(51) Int. Cl.
*H02J 7/00* (2006.01)
*H02J 7/34* (2006.01)
(Continued)

(52) U.S. Cl.
CPC ........ *H02J 7/00308* (2020.01); *H02J 7/0063* (2013.01); *H02J 7/345* (2013.01);
(Continued)

(58) Field of Classification Search
CPC ...... H02J 7/0031; H02J 7/0063; H02J 7/1415; H02J 7/00302; H02J 7/345; H02J 7/00308;
(Continued)

(56) References Cited

U.S. PATENT DOCUMENTS

| 4,809,122 A * | 2/1989 | Fitzner ................ H02H 7/0811 |
| | | 318/434 |
| 2016/0181836 A1* | 6/2016 | Kanabe .................... H02J 7/00 |
| | | 320/118 |

(Continued)

FOREIGN PATENT DOCUMENTS

| FR | 2678772 A1 * | 1/1993 | ............. G05F 3/185 |
| JP | S50-078940 U | 7/1975 | |

(Continued)

OTHER PUBLICATIONS

Machine translation of Bercy et al. French Patent Document FR 2678772 A1 Jan. 1993 (Year: 1993).*

(Continued)

*Primary Examiner* — Kevin J Comber
(74) *Attorney, Agent, or Firm* — Alston & Bird LLP (57) ABSTRACT

A protection circuit 60 is provided with: switches 61, 62 positioned on a power line PL of an electricity storage element 22 and a load 12; first protection elements 63, 64, 65 connected in parallel with the switches 61, 62 and absorbing surge caused when the switches 61, 62 open and cut off discharge current; and a second protection element 66 connected in parallel with the load and flowing, back to the load, the surge caused when the switches 61, 62 open and cut off the discharge current.

13 Claims, 7 Drawing Sheets

(51) Int. Cl.
*H03K 17/0812* (2006.01)
*H03K 17/0814* (2006.01)
(52) U.S. Cl.
CPC . *H03K 17/08122* (2013.01); *H03K 17/08142* (2013.01); *H02J 2310/48* (2020.01)
(58) Field of Classification Search
CPC ............... H02J 7/00304; H02J 2310/48; H02J 2310/46; H02H 3/087; H03K 17/08142; H03K 17/08122; H03K 17/6874
USPC .......................................................... 361/1
See application file for complete search history.

(56) References Cited

U.S. PATENT DOCUMENTS

| | | |
|---|---|---|
| 2017/0117798 A1 | 4/2017 | Basler et al. |
| 2018/0367133 A1 | 12/2018 | Yano et al. |
| 2020/0366278 A1 | 11/2020 | Nouda et al. |

FOREIGN PATENT DOCUMENTS

| | | |
|---|---|---|
| JP | H05-276650 A | 10/1993 |
| JP | 2013-040653 A | 2/2013 |
| JP | 2015-149531 A | 8/2015 |
| JP | 2015-226347 A | 12/2015 |
| JP | 2017-153064 A | 8/2017 |
| JP | 2019-054051 A | 4/2019 |
| JP | 2019-103063 A | 6/2019 |
| WO | WO-2017/086113 A1 | 5/2017 |

OTHER PUBLICATIONS

International Search Report and Written Opinion for International Application No. PCT/JP2020/044769, dated Feb. 9, 2021, (9 pages), Japan Patent Office, Tokyo, Japan.

\* cited by examiner

PROTECTIVE CIRCUIT AND ENERGY STORAGE APPARATUS

CROSS REFERENCE TO RELATED APPLICATIONS

This application is a national stage application, filed under 35 U.S.C. § 371, of International Application No. PCT/JP2020/044769, filed Dec. 2, 2020, which claims priority to Japanese Application No. 2019-222966, filed Dec. 10, 2019, the contents of both of which as are hereby incorporated by reference in their entirety.

BACKGROUND

Technical Field

The technique disclosed in the present specification relates to a protective circuit and an energy storage apparatus.

Description of Related Art

Conventionally, there has been known an energy storage apparatus including a switch that turns on and off current between an energy storage device and a load. In this type of energy storage apparatus, a technique for protecting a switch from a surge generated in a circuit is used. In a rectifier in a vehicle generator of Patent Document JP-A-2015-226347, a plurality of MOS transistors are connected in series between an output terminal and the ground (GND). A plurality of Zener diodes are connected in series so that the output terminal side of the vehicle generator becomes a cathode and the ground (GND) side becomes an anode. A breakdown voltage of the Zener diode is set to be equal to or less than a breakdown voltage of the MOS transistor, and when an overvoltage occurs during load dump, the Zener diode breaks down before the MOS transistor breaks down.

BRIEF SUMMARY

When lock current and short-circuit current of a starter are cut off by a switch, there is a large current change in short time, and a large surge occurs. When inductance of a load is large, a large surge similarly occurs even with a small current. When a withstand voltage of the switch is exceeded by the surge, there is a concern that a failure occurs.

The present specification discloses a technique for protecting a switch from a surge.

A protective circuit includes a switch located on a power line from an energy storage device to a load, a first protective element that is connected in parallel to the switch and absorbs a surge generated when the switch is opened and discharge current is cut off, and a second protective element that is connected in parallel to the load and returns the surge, which is generated when the switch is opened and discharge current is cut off, to the load.

As a non-limiting advantage realized, a switch can be protected from a surge.

DETAILED DESCRIPTION OF VARIOUS EMBODIMENTS

Outline of Present Embodiment

A protective circuit includes a switch located on a power line from an energy storage device to a load, a first protective element that is connected in parallel to the switch and absorbs a surge generated when the switch is opened and discharge current is cut off, and a second protective element that is connected in parallel to the load and returns the surge, which is generated when the switch is opened and discharge current is cut off, to the load. According to the above configuration, since the first protective element absorbs a surge and the second protective element returns the surge to the load, it is possible to suppress the surge applied to the switch when discharge current is cut off as compared with a case where only one of the protective elements is used. For this reason, the switch can be protected from a surge.

Absorption of a surge by the first protective element may be faster in response than return of a surge by the second protective element. In this way, a surge applied to the switch can be absorbed by the first protective element during a period until the second protective element returns the surge to the load.

The first protective element may include a plurality of the first protective elements including a capacitor connected in parallel to the switch, and a Zener diode connected in parallel to the switch. In this way, a surge can be absorbed by the capacitor so that the rise of the surge becomes gentle, and a surge that cannot be absorbed by the capacitor can be absorbed by the Zener diode.

The switch may be a field effect transistor (FET). The FET has a lower withstand voltage than a mechanical relay, and requires measures against a surge. By applying this technique, it is possible to protect the FET from a surge and suppress the occurrence of failure.

A signal line from a drive circuit to a control terminal of the switch may have a resistor. In a case where a resistor is provided in the signal line to the control terminal, the switching time is longer than that in a case where there is no resistor. For this reason, since a current change is reduced, a surge can be reduced.

An energy storage apparatus includes the protective circuit and the energy storage device. The energy storage apparatus may include a pair of external terminals connected to electrodes of the energy storage device, and the second protective element may be a freewheel diode and connected between the pair of the external terminals. Since the entire protective circuit including the second protective element can be provided inside the energy storage apparatus, measures against a surge can be taken without depending on the load.

First Embodiment

Figure 1:
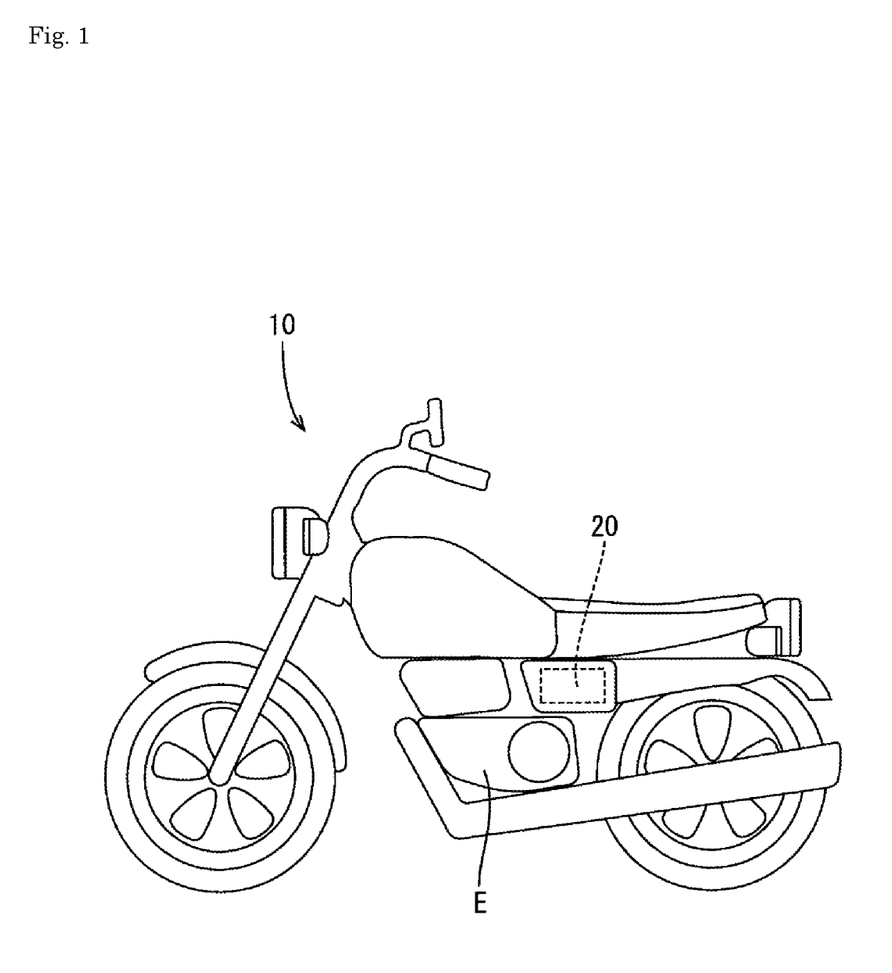
FIG. 1 is a side view of a motorcycle.

A first embodiment will be described with reference to FIGS. 1 to 8. As illustrated in FIG. 1, an energy storage apparatus 20 is a battery mounted on a motorcycle 10. The energy storage apparatus 20 is charged by an alternator 11 (FIG. 5) during operation of an engine E, and supplies power to a starter 12 at the time of start of the engine E.

1. Configuration of Energy Storage Apparatus 20

Figure 2:
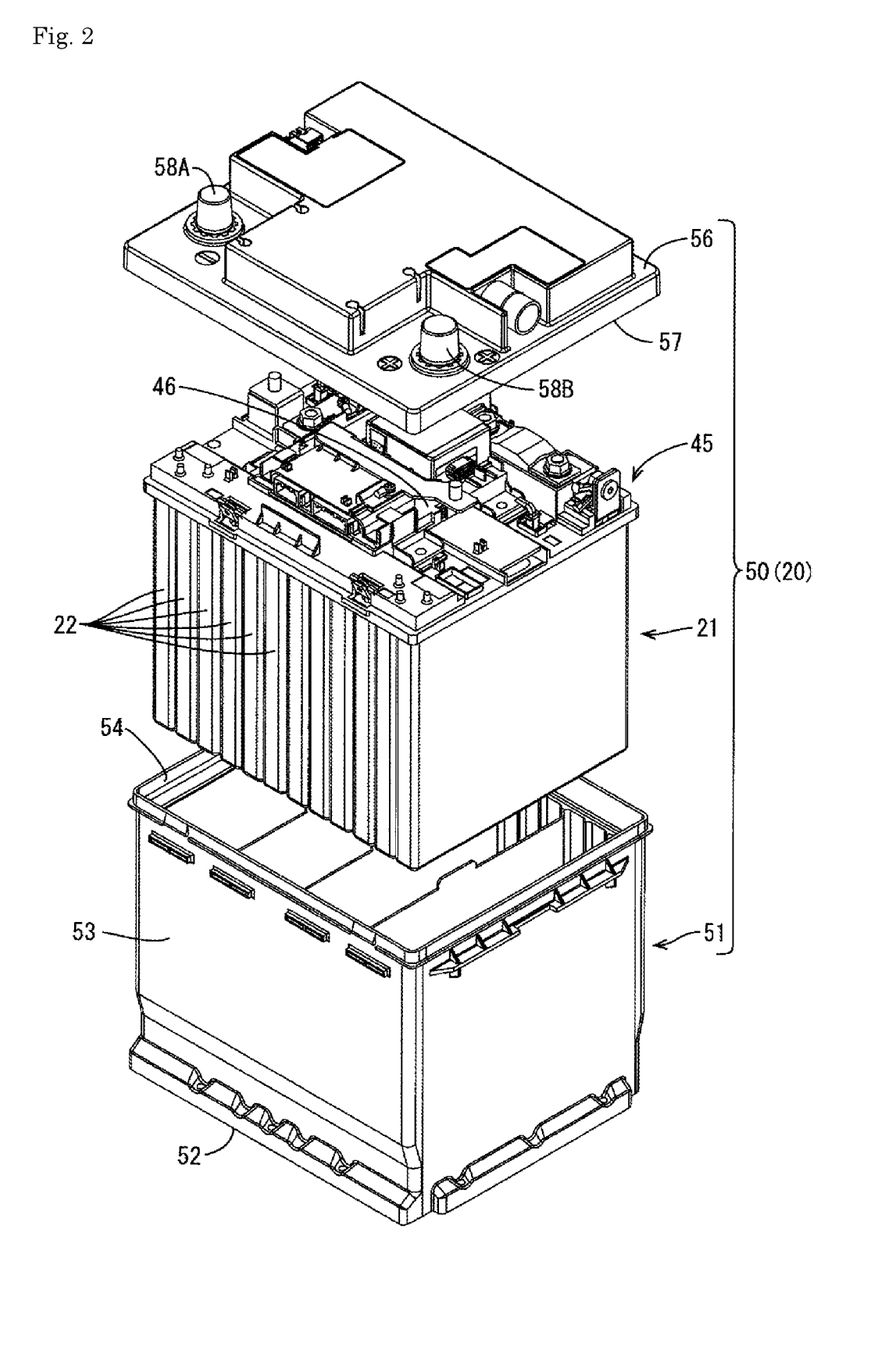
FIG. 2 is an exploded perspective view of an energy storage apparatus.

As illustrated in FIG. 2, the energy storage apparatus 20 includes an assembled battery 21, a circuit board unit 45, and a container 50. The container 50 includes a main body 51 made from a synthetic resin material and a lid body 56. The main body 51 has a bottomed cylindrical shape. The main body 51 includes a bottom surface portion 52 and four side surface portions 53. An upper opening portion 54 is formed at an upper end portion by the four side surface portions 53. The container 50 houses the assembled battery 21 and the circuit board unit 45. The circuit board unit 45 includes a circuit board 46 and an electronic component mounted on the circuit board 46, and is arranged in an upper portion of the assembled battery 21. The lid body 56 closes the upper opening portion 54 of the main body 51. A peripheral wall 57 is provided around the lid body 56. A cylindrical positive electrode external terminal 58A and a cylindrical negative electrode external terminal 58B are fixed to the lid body 56.

Figure 4:
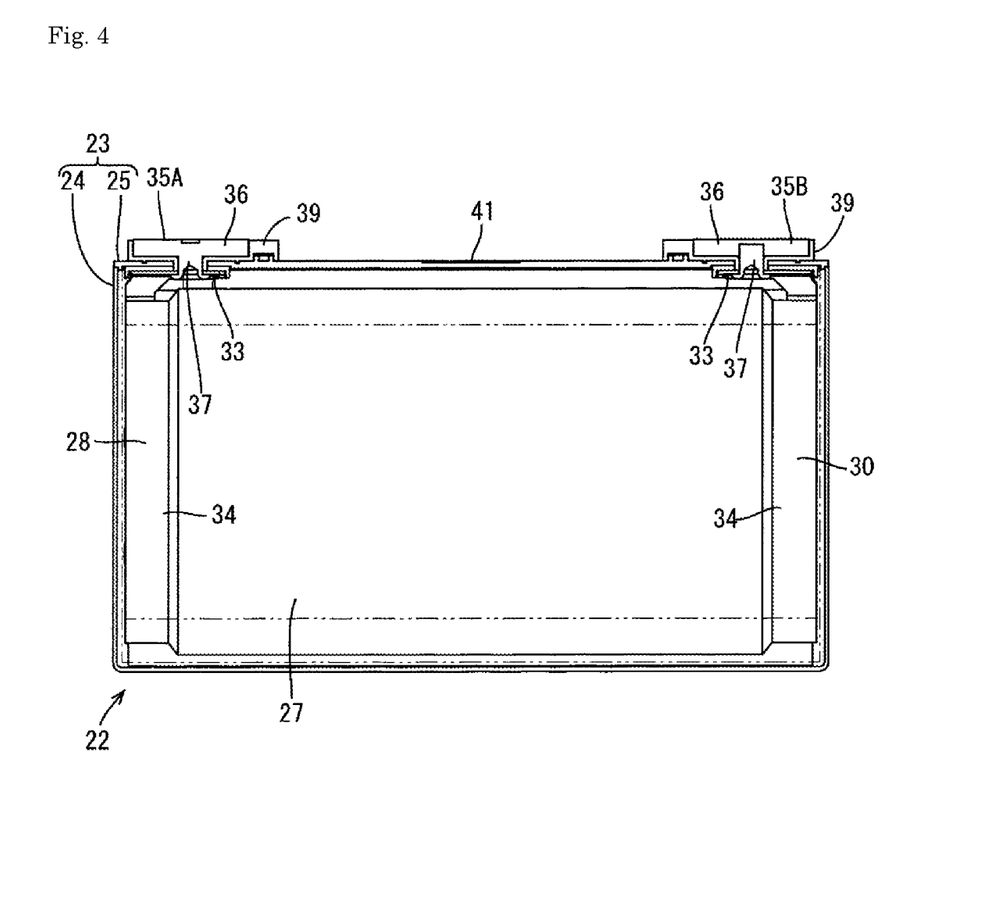
FIG. 4 is a cross-sectional view taken along line A-A of FIG. 3.

The assembled battery 21 has twelve secondary batteries 22. The secondary battery 22 is a chargeable and dischargeable energy storage device. Twelve of the secondary batteries 22 are connected in three parallel rows with four connected in series. As illustrated in FIG. 4, in the secondary battery 22, an electrode assembly 27 is housed in a case 23 having a rectangular parallelepiped shape together with a nonaqueous electrolyte. The secondary battery 22 is, for example, a lithium ion secondary battery. The case 23 includes a case main body 24 and a lid 25 that closes an opening portion on top of the case main body 24.

Although not shown in detail, the electrode assembly 27 is formed by arranging a separator formed from a porous resin film between a negative electrode element formed by applying an active material to a substrate formed from a copper foil and a positive electrode element formed by applying an active material to a substrate formed from an aluminum foil. These are wound in a flat shape so as to be housed in the case main body 24 in a state where the negative electrode element and the positive electrode element are shifted from each other to the opposite sides in the width direction with respect to the separator.

Figure 3:
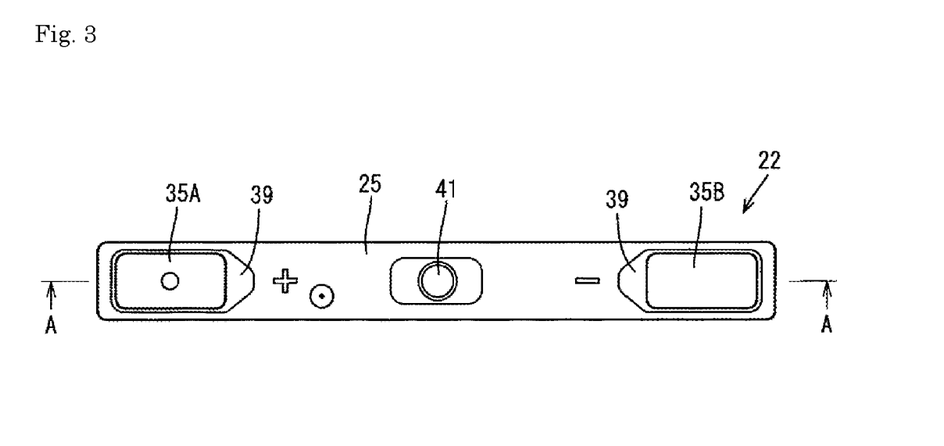
FIG. 3 is a plan view of a secondary battery.

A terminal 35A of a positive electrode is connected to the positive electrode element via a positive electrode current collector 28, and a terminal 35B of a negative electrode is connected to the negative electrode element via a negative electrode current collector 30. The positive electrode current collector 28 and the negative electrode current collector 30 include a flat plate-shaped base portion 33 and a leg portion 34 extending from the base portion 33. A through hole is formed in the base portion 33. The leg portion 34 is connected to the positive electrode element or the negative electrode element. The terminal 35A of a positive electrode and the terminal 35B of a negative electrode include a terminal main body portion 36 and a shaft portion 37 protruding downward from a center portion of a lower surface of the terminal main body portion 36. Among them, the terminal main body portion 36 and the shaft portion 37 of the terminal 35A of a positive electrode are integrally formed from aluminum (single material). In the terminal 35B of a negative electrode, the terminal main body portion 36 is made from aluminum, and the shaft portion 37 is made from copper, and these are assembled. The terminal main body portion 36 of the terminal 35A of a positive electrode and the terminal 35B of a negative electrode is arranged at both end portions of the lid 25 via a gasket 39 made from an insulating material, and is exposed outward from the gasket 39. As illustrated in FIG. 3, the lid 25 includes a pressure release valve 41. When an internal pressure of the case 23 exceeds a limit value, the pressure release valve 41 opens to lower the internal pressure of the case 23.

2. Electrical Configuration of Energy Storage Apparatus 20

Figure 5:
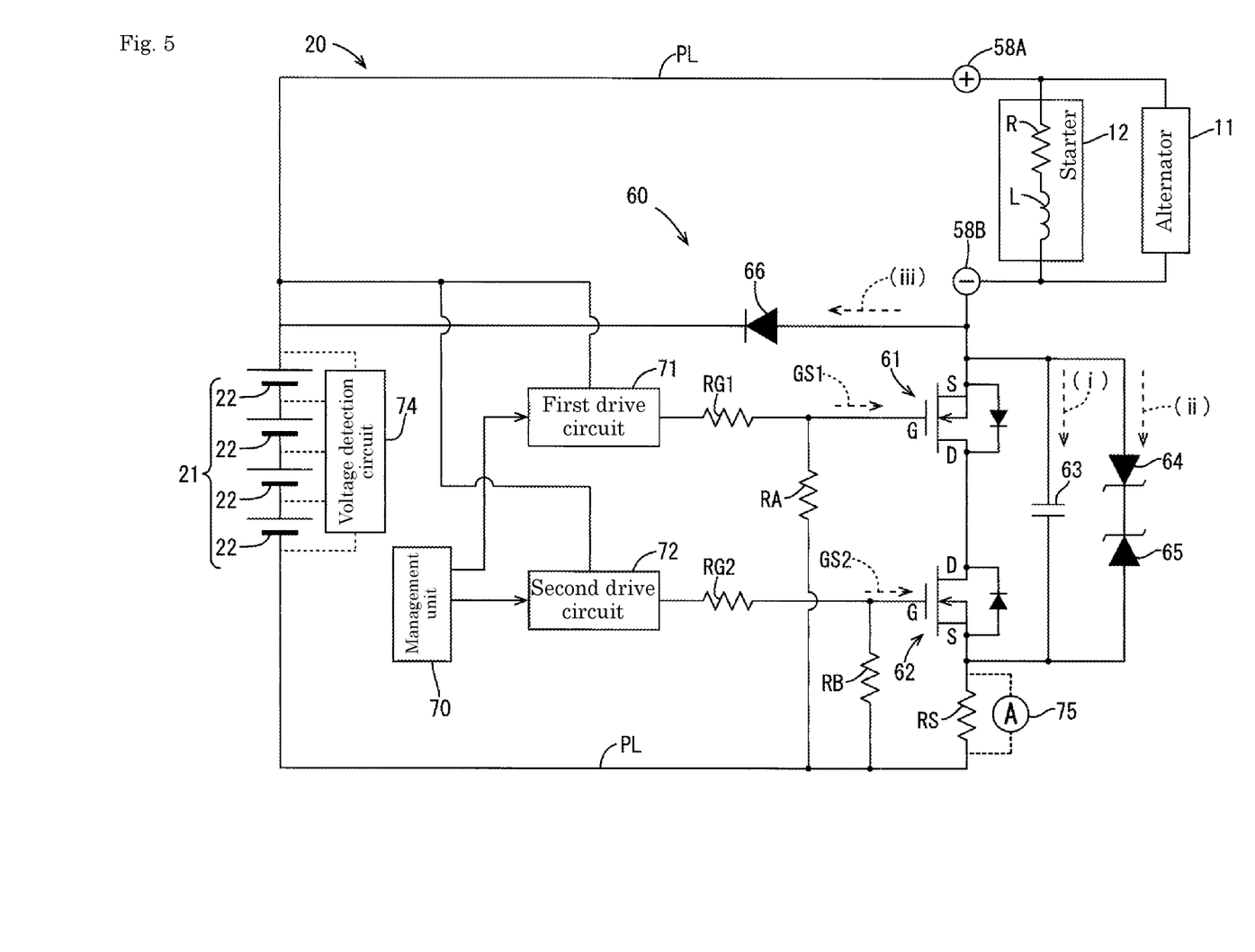
FIG. 5 is a block diagram illustrating an electrical configuration of the energy storage apparatus.

FIG. 5 is a block diagram of the energy storage apparatus 20. The energy storage apparatus 20 includes a pair of the external terminals 58A and 58B, the assembled battery 21, and the protective circuit 60. The assembled battery 21 includes a plurality of the secondary batteries 22. The assembled battery 21 has a rating of 12 V.

A positive electrode of the assembled battery 21 and the external terminal 58A are connected to each other, and a negative electrode of the assembled battery 21 and the external terminal 58B are connected to each other by a power line PL as a power supply path.

In this example, the starter 12 which is a load of the energy storage apparatus 20 is connected to the pair of the external terminals 58A and 58B. The starter 12 includes a motor or the like, and is driven by electric power supplied from the energy storage apparatus 20 to start the engine E. The starter 12 has a resistance component R and an inductance component L. The alternator 11 is connected to the pair of the external terminals 58A and 58B in parallel with the starter 12.

The protective circuit 60 is mounted on the circuit board 46 (FIG. 2). As illustrated in FIG. 5, the protective circuit 60 includes a pair of a first switch 61 and a second switch 62. The first switch 61 and the second switch 62 are connected in series. The first switch 61 and the second switch 62 may be, for example, a power field effect transistor (FET) capable of energizing a relatively large current. In this example, the power FET has an N channel, but may have a P channel.

The first switch 61 and the second switch 62 are connected by what is called back-to-back connection, and the drains of the two switches 61 and 62 are connected to each other. The back-to-back connection is a connection method for connecting the drains or sources of two FETs.

A gate G (control terminal) of the first switch 61 is connected to a first drive circuit 71 via a gate resistor RG1. That is, a signal line from the first drive circuit 71 to the gate G has the gate resistor RG1. The source of the first switch 61 is connected to the external terminal 58B of a negative electrode. A resistor RA is connected between the gate G of the first switch 61 and the reference potential (negative electrode of the assembled battery 21).

The gate G (control terminal) of the second switch 62 is connected to a second drive circuit 72 via a gate resistor RG2. That is, a signal line from the second drive circuit 72 to the gate G has the gate resistor RG2. The source of the second switch 62 is electrically connected to a negative electrode of the assembled battery 21 via a shunt resistor RS. An ammeter 75 is connected in parallel to the shunt resistor RS. The ammeter 75 detects current of the energy storage apparatus 20. A resistor RB is connected between the gate G of the second switch 62 and the reference potential (negative electrode of the assembled battery 21).

The first drive circuit 71 outputs a gate signal GS1 to the first switch 61 based on a control signal from a management unit 70 to switch between open and close of the first switch

61. The second drive circuit 72 outputs a gate signal GS2 to the second switch 62 based on a control signal from the management unit 70 to switch between open and close of the second switch 62.

When a high-level voltage is applied to the gate G, the first switch 61 is closed, and when a low-level voltage is applied, the first switch 61 is opened. The same applies to the second switch 62.

The energy storage apparatus 20 includes the management unit 70 and a voltage detection circuit 74. The voltage detection circuit 74 detects voltage of each of the secondary batteries 22 and total voltage of the assembled battery 21.

The management unit 70 includes a central processing unit (CPU) and a memory. The management unit 70 performs a monitoring processing of the energy storage apparatus 20 based on voltage of the secondary battery 22 and the like, outputs a control signal to the drive circuits 71 and 72, and controls open and close of the first switch 61 and the second switch 62.

In a case where both the first switch 61 and the second switch 62 are closed, the assembled battery 21 can be charged and discharged. The management unit 70 performs control to normally close the first switch 61 and the second switch 62. In a case where abnormality of the energy storage apparatus 20 is detected, the management unit 70 controls charge and discharge by switching between open and close of the first switch 61 and the second switch 62.

In a case where overcurrent is detected by the ammeter 75, the management unit 70 opens the first switch 61 via the first drive circuit 71 and opens the second switch 62 via the second drive circuit 72. The overcurrent can be cut off by opening of the first switch 61 and the second switch 62.

In a case where overcharge is detected from a detection result of the voltage detection circuit 74 and the ammeter 75, the management unit 70 opens the first switch 61 via the first drive circuit 71 and closes the second switch 62 via the second drive circuit 72. By opening the first switch 61 and closing the second switch 62, it is possible to cut off charge and perform only discharge. In this case, discharge current flows in a current path of a parasitic diode of the first switch 61 and the drain-source of the second switch 62. The first switch 61 is a switch that has no discharge cutoff function and cuts off charge of the energy storage apparatus 20.

In a case where overdischarge is detected from a detection result of the voltage detection circuit 74 and the ammeter 75, the management unit 70 closes the first switch 61 via the first drive circuit 71 and opens the second switch 62 via the second drive circuit 72. By closing the first switch 61 and opening the second switch 62, discharge current can be cut off and only charge current can be received. In this case, charging current flows through a current path of the drain-source of the first switch 61 and a parasitic diode of the second switch 62. The second switch 62 has a function of cutting off charge current, and cuts off discharge current of the energy storage apparatus 20.

3. Configuration for Absorbing Surge

When the pair of the switches 61 and 62 are opened to cut off current, a surge is generated by a counter electromotive force due to an inductance component of the starter 12. Hereinafter, a configuration for absorbing a surge will be described.

When a surge exceeding a withstand voltage Vdss (for example, 40 [V]) between the source and the drain occurs in the switches 61 and 62, there is a concern about a failure due to occurrence of avalanche breakdown of a parasitic diode. Therefore, a protective element is provided for the protective circuit 60 which includes the switches 61 and 62 and protects the energy storage apparatus 20. The protective element is an element that protects the switches 61 and 62 from a surge by suppressing a surge voltage to the withstand voltage Vdss or less.

The protective circuit 60 includes the switches 61 and 62, a capacitor 63 (an example of the "first protective element"), a Zener diode 65 (an example of the "first protective element"), and a freewheel diode 66 (an example of the "second protective element").

In the capacitor 63, one lead portion (terminal) is connected to a source S of the first switch 61, and the other lead portion (terminal) is connected to the source of the second switch 62. The capacitor 63 is connected in parallel to the switches 61 and 62. The capacitor 63 may be a ceramic capacitor using ceramic as a dielectric. Capacity of the ceramic capacitor of the present embodiment is 10 μg.

The capacitor 63 causes a high-frequency surge for a short-time until the Zener diode 65 or the freewheel diode 66 works to bypass to the reference potential (negative electrode of an assembled battery). The capacitor 63 is not limited to a ceramic capacitor, and may be an aluminum electrolytic capacitor using an oxide film formed on an anode by electrolysis as a dielectric, a tantalum capacitor using tantalum for an anode, an electric double layer capacitor using an organic electrolyte solution and using an electric double layer formed on a surface of an active carbon electrode as a dielectric, or the like.

A Zener diode 64 is connected in series to the Zener diode 65. Cathodes of a pair of the Zener diodes 64 and 65 are connected at the same potential.

An anode of the Zener diode 64 is connected to the source S of the first switch 61, and an anode of the other Zener diode 65 is connected to the source S of the second switch 62. A Zener voltage of each of the Zener diodes 64 and 65, that is, a breakdown voltage in the reverse direction is lower than the withstand voltage Vdss between the drain and the source of the first switch 61 and the second switch. In this example, the Zener voltage of each of the Zener diodes 64 and 65 is 27 [V].

The Zener diode 65 is a constant voltage diode that makes voltage between the drain and the source of the switch 62 constant voltage with respect to a surge at the time of discharge cutoff.

The Zener diode 65 suppresses the voltage between the drain and the source of the switch 62 to the withstand voltage Vdss or less.

Since the pair of the Zener diodes 64 and 65 are arranged in directions facing each other, it is possible to absorb a surge at both the time of charge cutoff and the time of discharge cutoff.

The freewheel diode (flyback diode) 66 is connected in parallel to the pair of the external terminals 58A and 58B. That is, an anode is connected to the negative electrode external terminal 58B, and a cathode is connected to the positive electrode external terminal 58A of. The freewheel diode 66 plays a role of returning a surge generated when discharge current is cut off to the starter 12 as a load.

In the freewheel diode 66, a Zener voltage is higher than a maximum voltage in a normal state between the external terminals 58A and 58B so as not to allow reverse current to flow in the normal state.

A current amount and rated power of the Zener diodes 64 and 65 and the freewheel diode 66 may be selected so that, for example, a surge generated when maximum lock current or short-circuit current is cut off can be absorbed by two elements.

4. Operation of Protective Circuit 60

When the starter 12 is locked, lock current (for example, 500 [A] or more) flows through the energy storage apparatus 20. When the ammeter 75 detects overcurrent exceeding a threshold, the management unit 70 opens a pair of the switches 61 and 62 to cut off current of the power line PL. At this time, surge voltage: L×dI/dt is generated by the inductance component L of the starter 12. In a case where L is 5 µH and cutoff time is 5 µsec, surge voltage is 500 [V], which exceeds withstand voltage of the switches 61 and 62.

In a case where discharge current is cut off by opening two of the switches 61 and 62, a parasitic diode of the first switch 61 is in the forward direction with respect to the surge. For this reason, generated voltage between the drain and the source of the first switch 61 is substantially equal to a voltage drop of the parasitic diode. In contrast, since a parasitic diode of the second switch 62 is in the opposite direction, voltage between the drain and the source rises due to the surge. Therefore, when the discharge current is cut off, it is necessary to suppress the voltage rise of the second switch 62.

Figure 7:
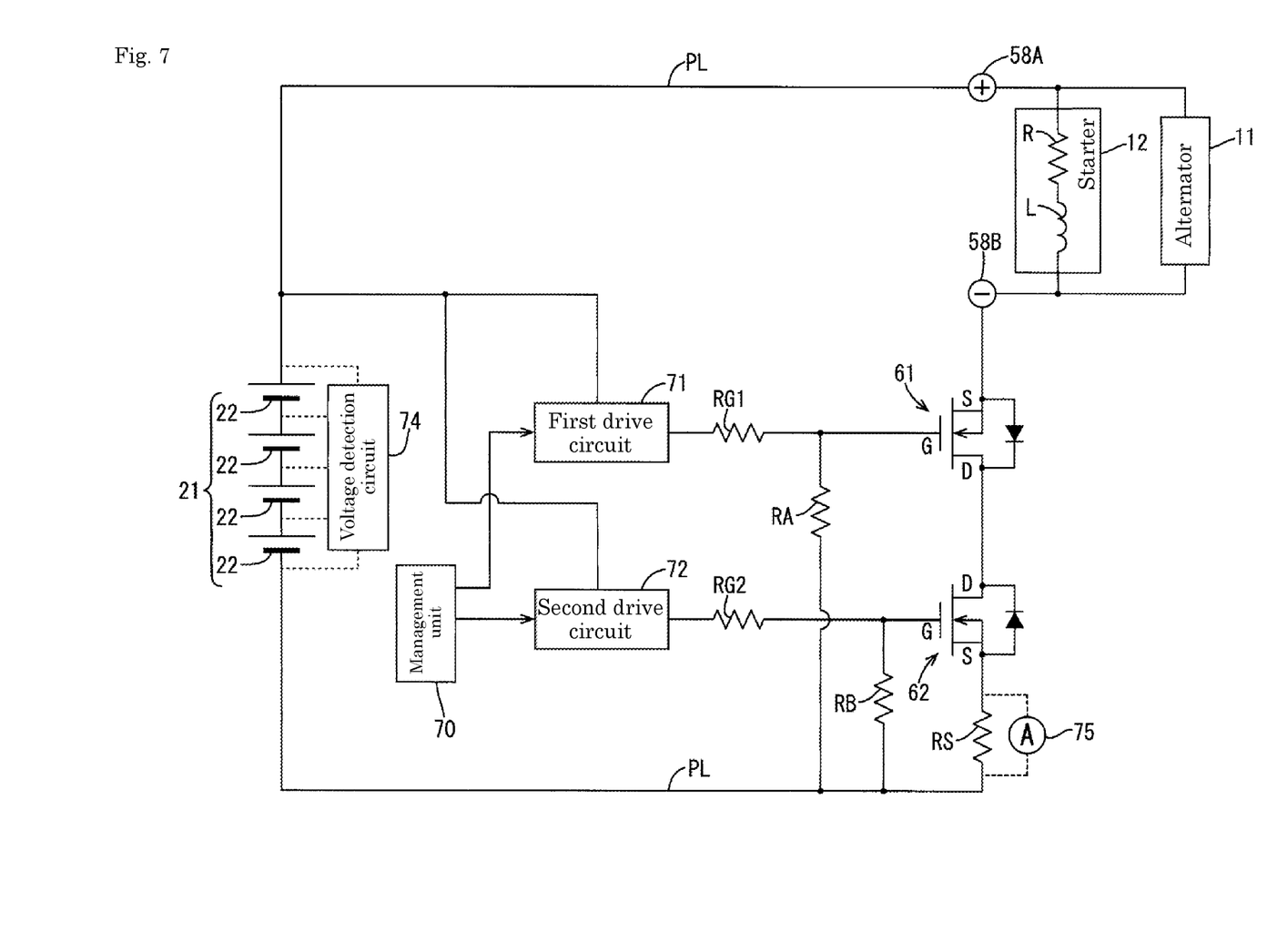
FIG. 7 is a block diagram illustrating an electrical configuration of an energy storage apparatus as a comparative example.
Figure 8:
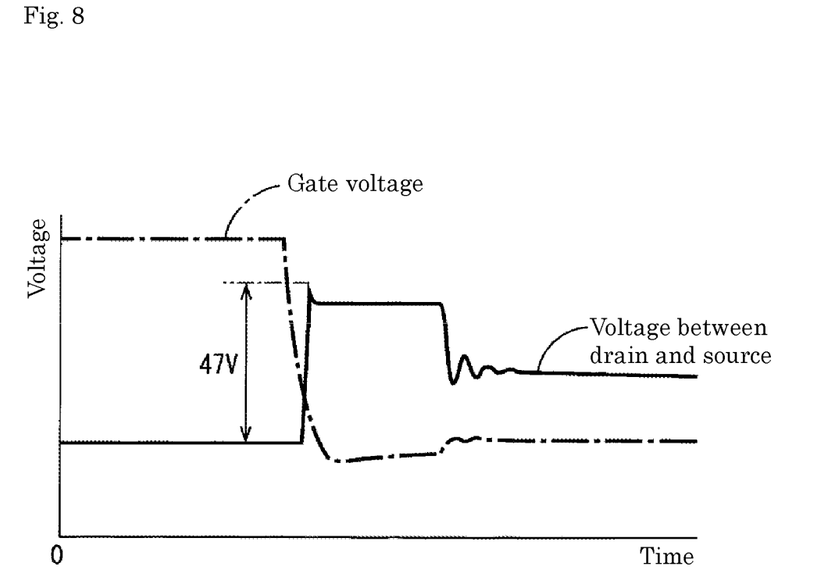
FIG. 8 illustrates a voltage waveform of the switch at the time of current interruption as a comparative example.

In a comparative example (circuit not provided with the capacitor 63, the Zener diodes 64 and 65, and the freewheel diode 66) of FIG. 7, as illustrated in FIG. 8, the drain-source voltage of the switch 62 rapidly increases (47 [V] in a test of FIG. 8) due to a surge when the switch 61 and the switch 62 are opened and current is cut off. For this reason, a problem may occur in the switch 62.

The protective circuit 60 of the present embodiment illustrated in FIG. 5 includes the capacitor 63, the Zener diodes 64 and 65, and the freewheel diode 66, and these three types of elements protect the second switch 62 from a surge generated when discharge current is cut off.

Absorption of the surge by the capacitor 63 is fastest in response than the other two protective elements. There is a difference in response times Ta and Tb between the absorption of the surge by the Zener diode 65 and return of the surge by the freewheel diode 66 as shown in Equation (1), the Zener diode 65 acts first to absorb the surge, and then the freewheel diode 66 acts to return the surge to the starter 12.

$$Ta < Tb \quad (1)$$

Ta is time from generation of the surge until the Zener diode 65 absorbs the surge. Ta is, for example, several usec.

Tb is time after the surge is generated until the freewheel diode 66 returns the surge to the starter 12. Tb is, for example, about 40 usec.

The reason why the response time Tb of the freewheel diode 66 is slower than the response time Ta of the Zener diode 65 is presumed to be that the voltage of the positive electrode of the assembled battery 21 is high immediately after the occurrence of the surge due to a counter electromotive force caused by the inductance component L of a wiring and the secondary battery 22.

Figure 6:
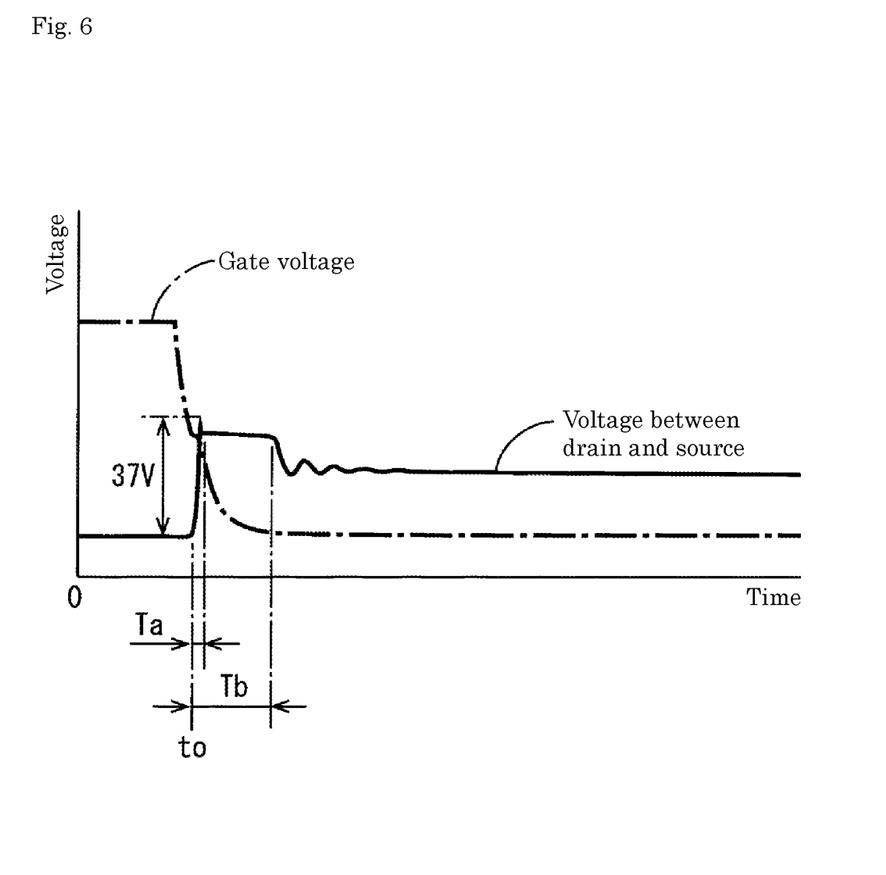
FIG. 6 illustrates a voltage waveform of a switch at the time of current interruption.

FIG. 6 illustrates a waveform of a gate voltage of the second switch 62 and a waveform of voltage between the drain and the source of the second switch 62.

After current is cut off at time t0, a surge is applied between the drain and the source of the second switch 62. For this reason, voltage increases, but the rise becomes gentle due to the capacitor 63 ((i) of FIG. 5 and t0 of FIG. 6). Then, when the capacitor 63 is charged, a surge flows through the Zener diodes 64 and 65, and the voltage is made constant by the Zener diode 65, so that the surge is absorbed ((ii) of FIG. 5 and Ta of FIG. 6). In this manner, an increase in the voltage between the drain and the source of the second switch 62 is suppressed (37 [V] in FIG. 6), and the voltage between the drain and the source of the second switch 62 (power FET) can be suppressed to be within the withstand voltage Vdss (40 [V]).

Then, when the response time Tb substantially elapses after current is cut off at time t0, the freewheel diode 66 acts, and the surge flows through the freewheel diode 66 and returns to the starter 12 ((iii) in FIG. 5). Since the surge applied to the second switch 62 can be reduced by returning the surge to the starter 12 through the freewheel diode 66, it is possible to suppress an increase in the voltage between the drain and the source of the second switch 62.

5. Operation and Effect of Present Embodiment

According to the present embodiment, a surge is absorbed by the capacitor 63 and the Zener diode 65, and the surge is returned to the starter 12 by the freewheel diode 66. In this manner, the switch 61 and the switch 62 can be protected from a surge generated when discharge current is cut off.

Absorption of a surge by the capacitor 63 and the Zener diode 65 (first protective element) is faster in response than return of a surge by the freewheel diode 66 (second protective element). In this way, since the capacitor 63 and the Zener diode 65 (first protective element) absorb a surge applied to the second switch 62 until the freewheel diode 66 starts to act after generation of the surge due to current cutoff. For this reason, increase in voltage of the second switch 62 can be suppressed, and voltage between the drain and the source can be suppressed to be equal to or less than a withstand voltage Vsdd. When the freewheel diode 66 starts to act, a surge returns to the starter 12 through the freewheel diode 66, so that it is possible to suppress a failure of the Zener diode 65 due to the rated power being exceeded.

The first protective element includes a plurality of the first protective elements including: the capacitor 63 connected in parallel to a pair of the switches 61 and 62; and the Zener diode 65 connected in parallel to a pair of the switches 61 and 62. In this way, a surge can be absorbed by the capacitor 63 so that the rise of the surge becomes gentle, and a surge that cannot be absorbed by the capacitor 63 can be absorbed by the Zener diode 65.

The gate resistor RG1 and the gate resistor RG2 are connected to the gates G of the switch 61 and the switch 62. In a case where the gate resistors RG1 and RG2 are provided, switching time is longer than that in a case where there is no resistor. For this reason, since a current change is reduced, a surge can be reduced. By setting resistance values of the gate resistors RG1 and RG2 to optional values, a waveform and a time constant of a surge can be adjusted. Voltage increase of the switch can be suppressed by making a waveform of a surge gentle. By changing the resistance values of the gate resistors RG1 and RG2, an effect similar to that of the capacitor 63 can be obtained.

OTHER EMBODIMENTS

The technique described in the present specification is not limited to the embodiment described with reference to the above description and diagrams, and for example, an embodiment below is also included in the technical scope of the present invention.

(1) In the above embodiment, the secondary battery 22 is exemplified as an example of the energy storage device. The energy storage device is not limited to the secondary battery 22, and may be a capacitor. The secondary battery 22 is not limited to a lithium ion secondary battery, and may be another nonaqueous electrolyte secondary battery. A lead-acid battery or the like can also be used. The energy storage devices are not limited to the case where a plurality of the energy storage devices are connected in series and parallel, and may be connected in series or may have a configuration of a single cell.

(2) In the above embodiment, the energy storage apparatus 20 is used for starting an engine. The use application of the energy storage apparatus 20 is not limited to a specific application. The energy storage apparatus 20 may be used in various applications such as a mobile object (for a vehicle, a ship, an automated guided vehicle (AGV), or the like) and an industrial application (an energy storage apparatus of an uninterruptible power supply system or a solar power generating system).

(3) In the above embodiment, the energy storage apparatus 20 for a two-wheeled vehicle is described as an example, but the present invention is not limited to this configuration. For example, the energy storage apparatus 20 may be an energy storage apparatus for a vehicle such as an electric vehicle or a hybrid vehicle.

(4) In the above embodiment, two types of the first protective elements are connected in parallel to the first switch 61 and the second switch 62. That is, the capacitor 63 and a pair of the Zener diodes 64 and 65 are connected in parallel. The first protective element may be any one of a capacitor and a Zener diode.

(5) As the first protective element, a varistor may be used instead of the capacitor 63 and the Zener diodes 64 and 65. A varistor is an electronic component having two electrodes, and having property that electric resistance is high when a voltage between both electrodes is low, but the electric resistance rapidly decreases when the voltage increases to some extent or more.

(6) In the first embodiment, the Zener diode 64 is provided in series with the Zener diode 65. However, the configuration may be such that the Zener diode 64 is eliminated and only a Zener diode 6 is provided.

(7) In the first embodiment, the absorption of a surge by the first protective element is faster in response than the return of a surge by the second protective element. The response speeds may be the same.

(8) In the first embodiment, the first switch 61 and the second switch 62 are provided. However, the configuration may be such that the first switch 61 is eliminated and only the second switch 62 is provided. The configuration may be such that only discharge current is cut off by the second switch 62. The switch is not limited to a semiconductor switch such as an FET, and may be a mechanical switch having a mechanical contact such as a relay.

(9) In the first embodiment, the first switch 61 and the second switch 62 are arranged on a negative electrode of the assembled battery 21, but may be arranged on a positive electrode.

The invention claimed is:

1. An energy storage apparatus protective circuit comprising:
    a container provided with a pair of external terminals;
    an energy storage device housed in the container; and
    a protective circuit housed in the container and comprising:
        back-to-back connected FETs located on a power line from the energy storage device to the pair of external terminals;
        a first protective element that is connected in parallel to the FETs and absorbs a surge generated when the FETs are opened and discharge current is cut off; and
        a second protective element that is connected in parallel to a load, which is connected to the pair of external terminals and is outside the container, and returns the surge, which is generated when the FETs are opened and discharge current is cut off, to the load,
    wherein:
        the first protective element includes a plurality of the first protective elements including: a capacitor connected in parallel to the switch; and a Zener diode connected in parallel to the switch, and
        the energy storage apparatus has a rating of 12 volts.

2. The energy storage apparatus according to claim 1, wherein absorption of the surge by the first protective element is faster in response than return of the surge by the second protective element.

3. The energy storage apparatus according to claim 1, wherein a signal line from a drive circuit to a control terminal of each of the FETs has a resistor.

4. The energy storage apparatus according to claim 1, wherein
    the pair of external terminals are connected to electrodes of the energy storage device, and the second protective element is a freewheel diode.

5. The energy storage apparatus according to claim 1, further comprising a circuit board, which is housed in the container and is placed between the energy storage device and a lid body of the container, wherein the protective circuit is constructed on the circuit board.

6. The energy storage apparatus according to claim 1, wherein the energy storage device comprises lithium ion secondary batteries constructing an assembled battery.

7. The energy storage apparatus according to claim 1, wherein the back-to-back connected FETs comprise a pair of N channel FETs located on the power line between a negative electrode of the energy storage device and a negative external terminal of the pair of external terminals.

8. An energy storage apparatus comprising:
    a container provided with a pair of external terminals;
    an energy storage device housed in the container; and
    a protective circuit housed in the container and comprising:
        back-to-back connected FETs located on a power line from the energy storage device to the pair of external terminals;
        a first protective element that is connected in parallel to the FETs and absorbs a surge generated when the FETs are opened and discharge current is cut off; and
        a second protective element that is connected in parallel to a load, which is connected to the pair of external terminals and is outside the container, and returns the surge, which is generated when the FETs are opened and discharge current is cut off, to the load,
    wherein the energy storage apparatus has a rating of 12 volts.

9. The energy storage apparatus according to claim 8, wherein absorption of the surge by the first protective element is faster in response than return of the surge by the second protective element.

10. The energy storage apparatus according to claim 8, wherein a signal line from a drive circuit to a control terminal of each of the FETs has a resistor.

11. The energy storage apparatus according to claim 8, further comprising a circuit board, which is housed in the container and is placed between the energy storage device and a lid body of the container, wherein the protective circuit is constructed on the circuit board.

12. The energy storage apparatus according to claim 8, wherein the energy storage device comprises lithium ion secondary batteries constructing an assembled battery.

13. The energy storage apparatus according to claim 8, wherein the back-to-back connected FETs comprise a pair of N channel FETs located on the power line between a negative electrode of the energy storage device and a negative external terminal of the pair of external terminals.

* * * * *

UNITED STATES PATENT AND TRADEMARK OFFICE
CERTIFICATE OF CORRECTION

PATENT NO. : 12,184,102 B2
APPLICATION NO. : 17/756509
DATED : December 31, 2024
INVENTOR(S) : Fujimatsu et al.

Page 1 of 1

It is certified that error appears in the above-identified patent and that said Letters Patent is hereby corrected as shown below:

In the Claims

<u>Column 9,</u>
Line 64, Claim 1, "energy storage apparatus protective circuit" should read --energy storage apparatus--.

Signed and Sealed this
Eighth Day of July, 2025

Coke Morgan Stewart
*Acting Director of the United States Patent and Trademark Office*